United States Patent
Yi et al.

(10) Patent No.: US 10,192,874 B2
(45) Date of Patent: Jan. 29, 2019

(54) NONVOLATILE MEMORY CELL AND FABRICATION METHOD THEREOF

(71) Applicant: UNITED MICROELECTRONICS CORP., Hsin-Chu (TW)

(72) Inventors: Liang Yi, Singapore (SG); Chih-Chien Chang, Hsinchu (TW); Shen-De Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/626,179

(22) Filed: Jun. 19, 2017

(65) Prior Publication Data
US 2018/0366478 A1    Dec. 20, 2018

(51) Int. Cl.
| H01L 29/788 | (2006.01) |
| H01L 27/11521 | (2017.01) |
| H01L 27/11556 | (2017.01) |
| H01L 29/66 | (2006.01) |
| H01L 29/423 | (2006.01) |

(52) U.S. Cl.
CPC .. *H01L 27/11521* (2013.01); *H01L 27/11556* (2013.01); *H01L 29/42328* (2013.01); *H01L 29/66825* (2013.01); *H01L 29/788* (2013.01)

(58) Field of Classification Search
CPC ................................. H01L 29/42328
See application file for complete search history.

(56) References Cited

U.S. PATENT DOCUMENTS

| 5,168,465 | A | * | 12/1992 | Harari | G11C 11/5621 257/320 |
| 5,268,318 | A | * | 12/1993 | Harari | G11C 11/5621 257/320 |
| 5,268,319 | A | * | 12/1993 | Harari | G11C 11/5621 257/320 |
| 5,963,806 | A | * | 10/1999 | Sung | H01L 29/66825 257/E21.209 |
| 6,462,988 | B1 | * | 10/2002 | Harari | G11C 11/5621 257/E21.209 |
| 6,747,310 | B2 | * | 6/2004 | Fan | H01L 27/11521 257/316 |
| 7,061,805 | B2 | * | 6/2006 | Hung | G11C 16/0483 365/185.17 |
| 8,093,649 | B2 | * | 1/2012 | Lin | H01L 21/28273 257/314 |
| 8,669,607 | B1 | * | 3/2014 | Tsair | H01L 29/7881 257/316 |
| 8,785,307 | B2 | * | 7/2014 | Liu | H01L 21/26586 257/E21.618 |
| 8,928,060 | B2 | * | 1/2015 | Tsair | H01L 27/11517 257/316 |

(Continued)

FOREIGN PATENT DOCUMENTS

WO    WO 2015/017495    *  2/2015    ............ H01L 21/28

*Primary Examiner* — Victoria K Hall
(74) *Attorney, Agent, or Firm* — Winston Hsu

(57) ABSTRACT

A nonvolatile memory cell includes a substrate having a drain region, a source region, and a channel region between the drain region and the source region. A floating gate and a select gate are disposed on the channel region. A control gate is disposed on the floating gate. An erase gate is disposed on the source region. The erase gate includes a lower end portion that extends into a major surface of the substrate.

15 Claims, 6 Drawing Sheets

(56) References Cited

U.S. PATENT DOCUMENTS

| | | | |
|---|---|---|---|
| 9,548,312 B1 | 1/2017 | Beyer | |
| 9,634,020 B1* | 4/2017 | Su | H01L 29/0847 |
| 2006/0098486 A1* | 5/2006 | Hung | G11C 16/0483 |
| | | | 365/185.17 |
| 2008/0217675 A1* | 9/2008 | Liu | H01L 21/28273 |
| | | | 257/321 |
| 2009/0039410 A1* | 2/2009 | Liu | H01L 21/28273 |
| | | | 257/320 |
| 2009/0166708 A1* | 7/2009 | Io | H01L 21/28273 |
| | | | 257/319 |
| 2010/0044773 A1* | 2/2010 | Ishigaki | H01L 27/11521 |
| | | | 257/320 |
| 2010/0290292 A1* | 11/2010 | Tanizaki | G11C 16/10 |
| | | | 365/185.22 |
| 2011/0309429 A1* | 12/2011 | Kiyotoshi | B82Y 30/00 |
| | | | 257/321 |
| 2015/0021679 A1* | 1/2015 | Tsair | H01L 29/788 |
| | | | 257/320 |

* cited by examiner

NONVOLATILE MEMORY CELL AND FABRICATION METHOD THEREOF

BACKGROUND OF THE INVENTION

1. Field of the Invention

The present invention relates generally to the field of semiconductor memory devices. More particularly, the present invention relates to a nonvolatile memory cell and a method for fabricating the same.

2. Description of the Prior Art

Nonvolatile memory cells are known in the art. For example, U.S. Pat. No. 9,548,312 discloses a type of nonvolatile memory cell structure including a floating gate and a select gate over a channel region of a substrate. The floating gate is insulated from the select gate. The select gate is disposed over a first end portion of the floating gate and covers a first sidewall of the floating gate.

An erase gate, which is disposed on a source region and is spaced apart from the select gate, is formed over a second end portion of the floating gate and covers a second sidewall of the floating gate that is opposite to the first sidewall. The erase gate is insulated from the floating gate by a tunneling layer. An insulation region is provided between the erase gate and the source region.

In general, the prior art nonvolatile memory cell structures have insufficient erase efficiency. It is always desirable in this technical field to provide an improved nonvolatile memory cell with increased erase efficiency.

SUMMARY OF THE INVENTION

It is one object of the invention to provide a nonvolatile memory cell with increased erase efficiency.

According to one aspect of the invention, a nonvolatile memory cell is disclosed. The nonvolatile memory cell includes a substrate having a drain region, a source region, and a channel region between the drain region and the source region. A floating gate and a select gate are disposed on the channel region. A control gate is disposed on the floating gate. An erase gate is disposed on the source region. The erase gate comprises a lower end portion that extends into a major surface of the substrate.

According to one aspect of the invention, a method for fabricating a nonvolatile memory cell is disclosed. A substrate having thereon gate structure comprising a floating gate and a control gate on the floating gate is provided. A recessed region is then formed in the substrate adjacent to the floating gate. A source region is then formed in the substrate. The source region overlaps with the recessed region. A tunnel dielectric layer is formed on the gate structure and in the recessed region. An erase gate is formed in and on the recessed region.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

FIG. 1 to FIG. 10 are schematic, cross-sectional diagrams showing a method for fabricating a nonvolatile memory cell according to one embodiment of the invention.

Figure 1:
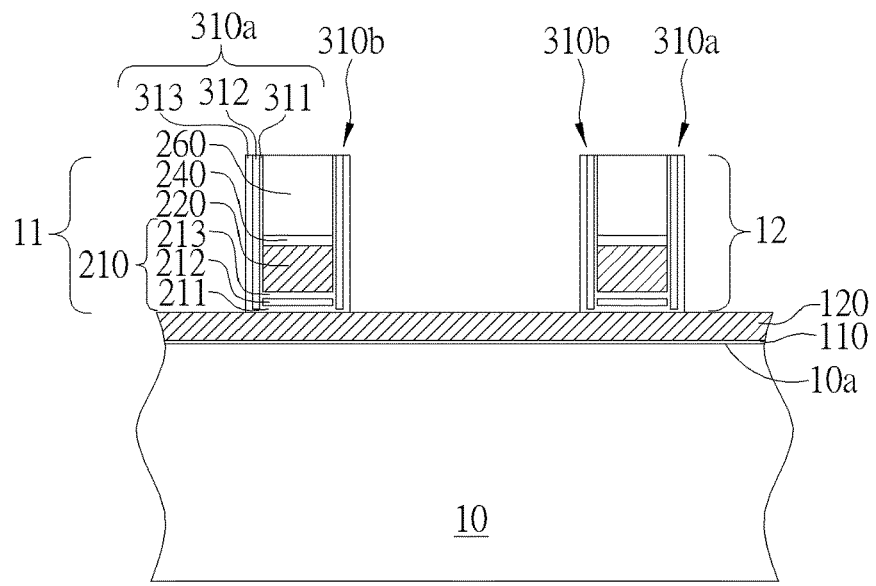
FIG. 1 to FIG. 10 are schematic, cross-sectional diagrams showing a method for fabricating a nonvolatile memory cell according to one embodiment of the invention.

As shown in FIG. 1, a substrate 10 such as a silicon substrate is provided. The substrate 10 has a major surface 10a. According to one embodiment, an insulating layer 110 and a polysilicon layer 120 are deposited over the major surface 10a of the substrate 10 in a blanket manner. Control gates 11 and 12 are formed on the polysilicon layer 120. The control gate 11 is disposed in close proximity to the control gate 12.

It is understood that the two control gates 11 and 12 are for illustration purposes only. Multiple control gates may be formed within the memory array region. The present invention is not limited to the illustrated two control gates.

According to one embodiment, the control gates 11 and 12 have the same film stack structure. For example, the control gate 11 has a control gate electrode layer 220 over an insulating layer 210. According to one embodiment, the insulating layer 210 may comprise an oxide-nitride-oxide (ONO) film including a lower silicon oxide layer 211, an intermediate silicon nitride layer 212, and an upper silicon oxide layer 213.

According to one embodiment, a dielectric buffer layer 240 and a dielectric cap layer 260 may be provided atop the control gate electrode layer 220. According to one embodiment, each of the control gates has two opposite vertical sidewalls. On the two opposite vertical sidewalls, a spacer 310a and a spacer 310b may be formed.

According to one embodiment, each of the spacers 310a and 310b may comprise an ONO film including an inner silicon oxide layer 311, an intermediate silicon nitride layer 312, and an outer silicon oxide layer 313. According to one embodiment, the inner silicon oxide layer 311 is in direct contact with the insulating layer 210, the control gate electrode layer 220, the dielectric buffer layer 240, and the dielectric cap layer 260.

Figure 2:
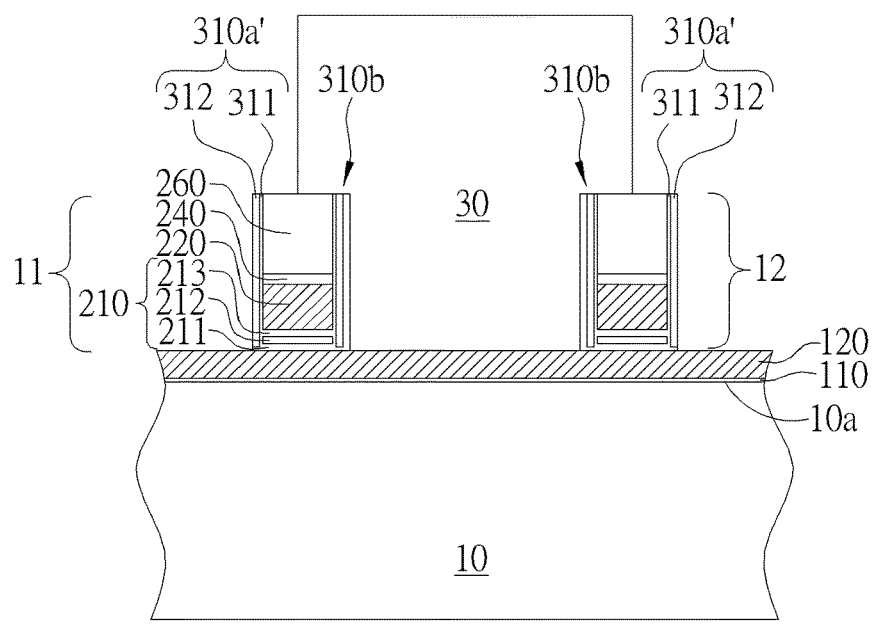

As shown in FIG. 2, according to one embodiment, a photoresist pattern 30 is formed on the substrate 10. The photoresist pattern 30 partially overlaps with the control gates 11 and 12. The spacers 310b on the control gates 11 and 12 are covered by the photoresist pattern 30. The spacers 310a on the control gates 11 and 12 are not covered by the photoresist pattern 30. Subsequently, an etching process is performed to selectively remove the outer silicon oxide layer 313, thereby forming spacers 310a' consisting of the inner silicon oxide layer 311 and the intermediate silicon nitride layer 312. Subsequently, the photoresist pattern 30 is removed.

Figure 3:
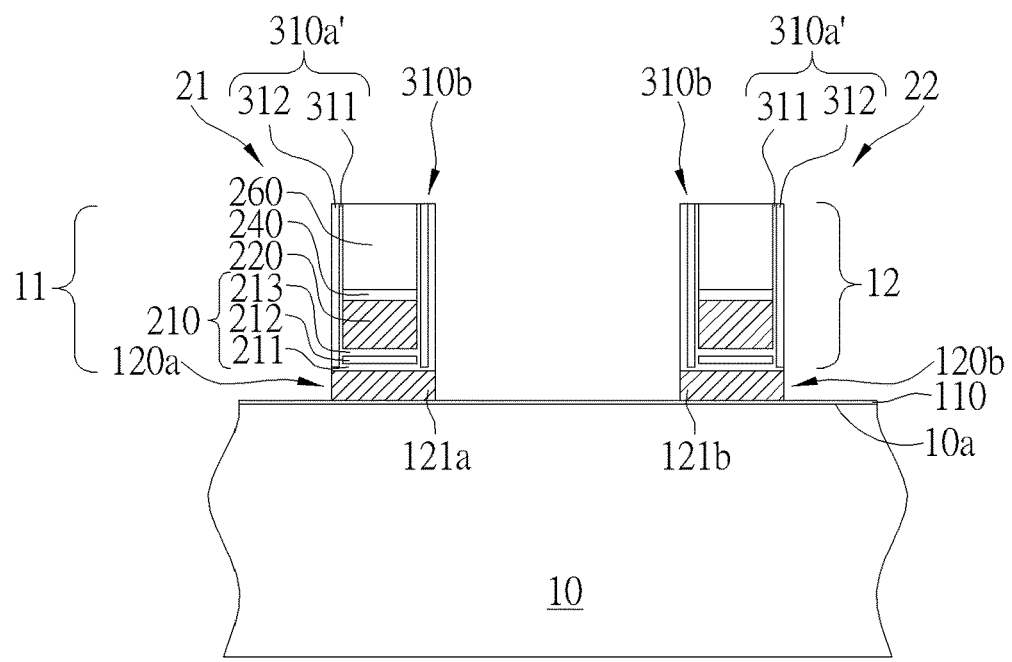

As shown in FIG. 3, a self-aligned dry etching process is then performed to etch the exposed polysilicon layer 120, thereby forming the floating gates 120a and 120b directly under the control gates 11 and 12, respectively. After the self-aligned dry etching process, stacked gate structures 21 and 22 are formed. According to one embodiment, the floating gates 120a and 120b have protruding end portions 121a and 121b, respectively, which are situated directly under the spacers 310b. The protruding end portions 121a and 121b protrude beyond vertical sidewalls of the control gates 11 and 12, respectively.

Figure 4:
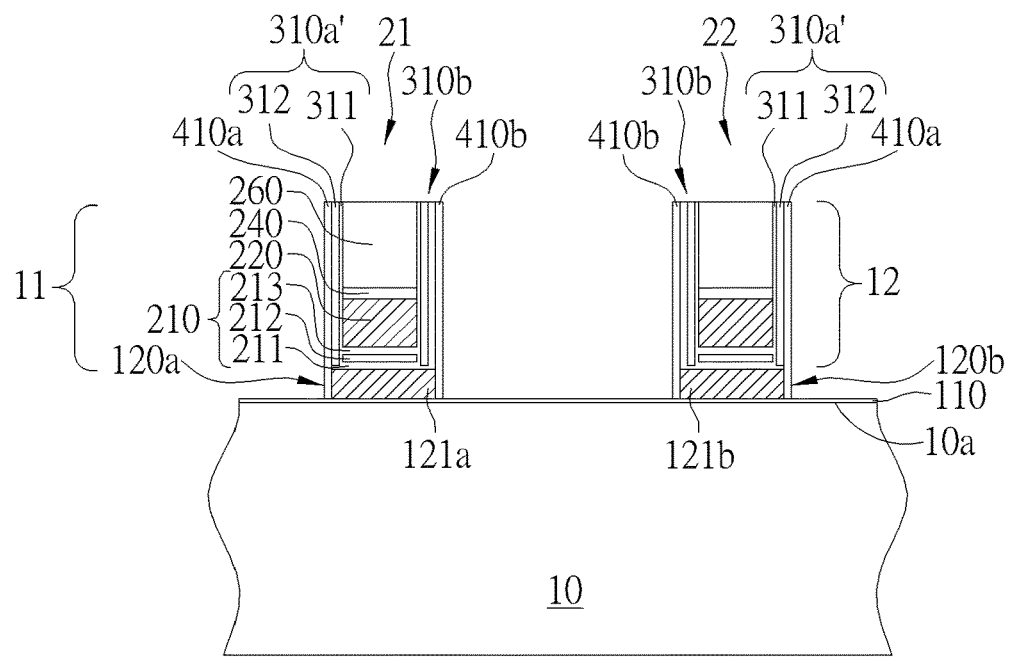

As shown in FIG. 4, after the formation of the stacked gate structures 21 and 22, offset spacers 410a and 410b are formed on the stacked gate structures 21 and 22, respectively. According to one embodiment, the offset spacers 410a and 410b may be silicon oxide spacers, but is not limited thereto. According to one embodiment, the offset spacer 410a is formed directly on the spacers 310a'. According to one embodiment, the offset spacer 410b is formed directly on the spacers 310b. The offset spacers 410a and 410b insulate the sidewalls of the floating gates 120a and 120b.

Figure 5:
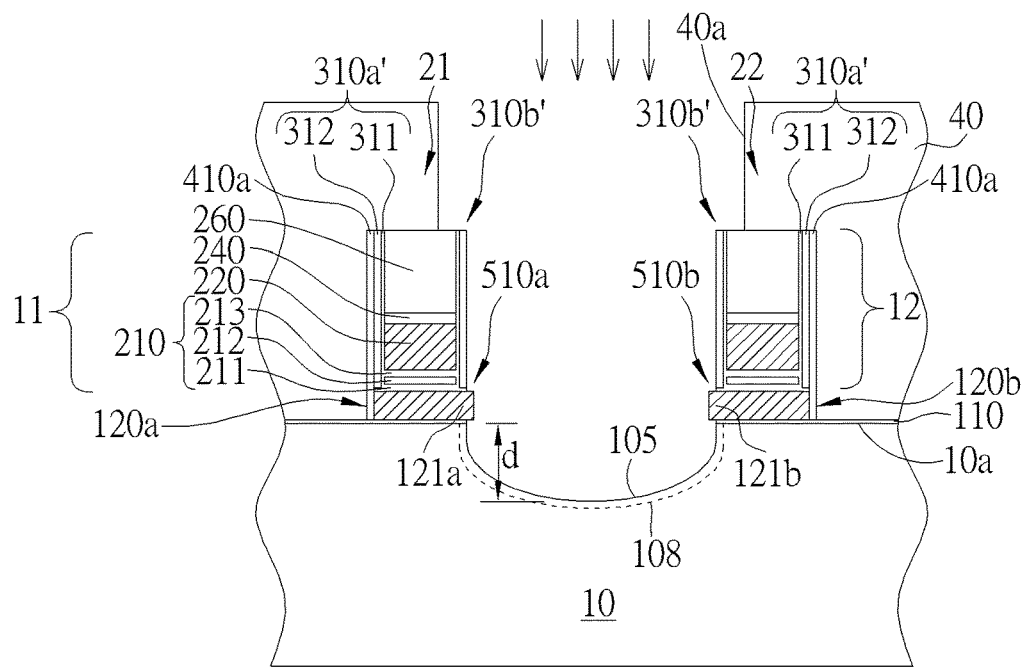

As shown in FIG. 5, a photoresist pattern 40 is formed on the substrate 10. The photoresist pattern 40 partially overlaps with the stacked gate structures 21 and 22. The photoresist pattern 40 includes an opening 40a that exposes the spacers 310b and the offset spacers 410b between the two adjacent stacked gate structures 21 and 22.

Subsequently, an anisotropic dry etching process is carried out to etch the exposed insulating layer 110 and the substrate 10, thereby forming a recessed region 105 in the substrate 10 adjacent to the floating gates 120a and 120b. According to one embodiment, the recessed region 105 has a depth d below the major surface 10a of the substrate 10. For example, the depth d may be shallower than 0.1 micrometers.

An ion implantation process may be carried out to form a source region 108 in the substrate 10. According to one embodiment, the source region 108 may be an N$^+$ source region. According to one embodiment, the source region 108 may completely overlap with the recessed region 105. According to one embodiment, the recessed region 105 is disposed within the source region 108. The source region 108 may be formed before the formation of the recessed region 105. Alternatively, the source region 108 may be formed after the formation of the recessed region 105.

Subsequently, the offset spacers 410b are removed and the outer silicon oxide layers 313 of the spacers 310b are removed, thereby forming spacers 310b'.

After removing the outer silicon oxide layers 313 of the spacers 310b and the offset spacers 410b, a step structure 510a is formed between the protruding end portion 121a and the substrate 10 and a step structure 510b is formed between the protruding end portion 121b and the substrate 10. The photoresist pattern 40 is then removed.

Figure 6:
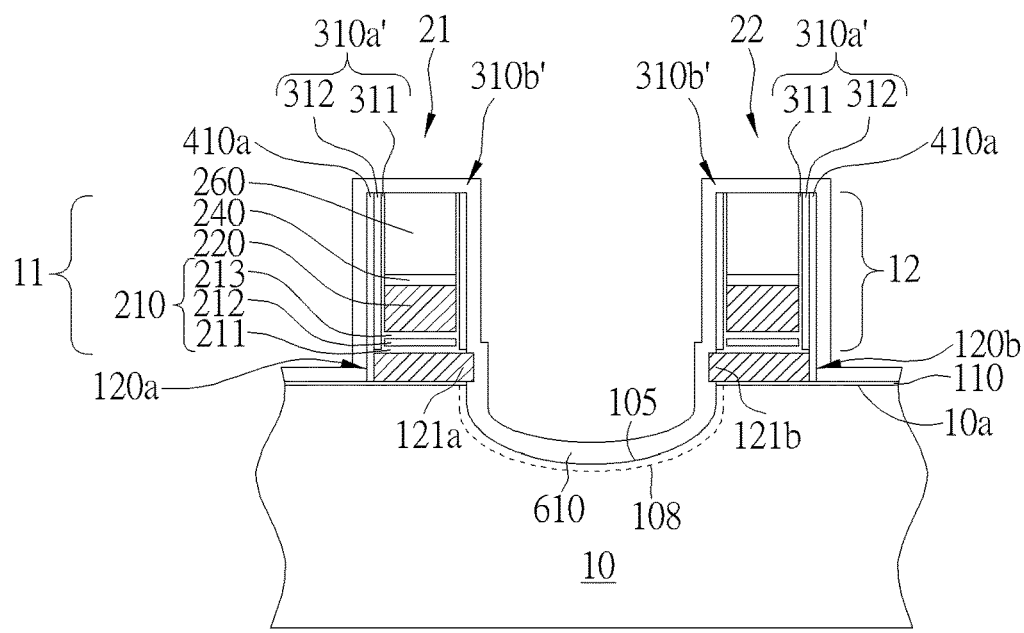

As shown in FIG. 6, subsequently, a tunnel dielectric layer 610 is conformally deposited over the stacked gate structures 21, 22, over the substrate 10, and in the recessed region 105. According to one embodiment, the tunnel dielectric layer 610 comprises a high-temperature oxide (HTO) film, but is not limited thereto. According to the embodiment, the tunnel dielectric layer 610 is in direct contact with the protruding end portions 121a and 121b.

Figure 7:
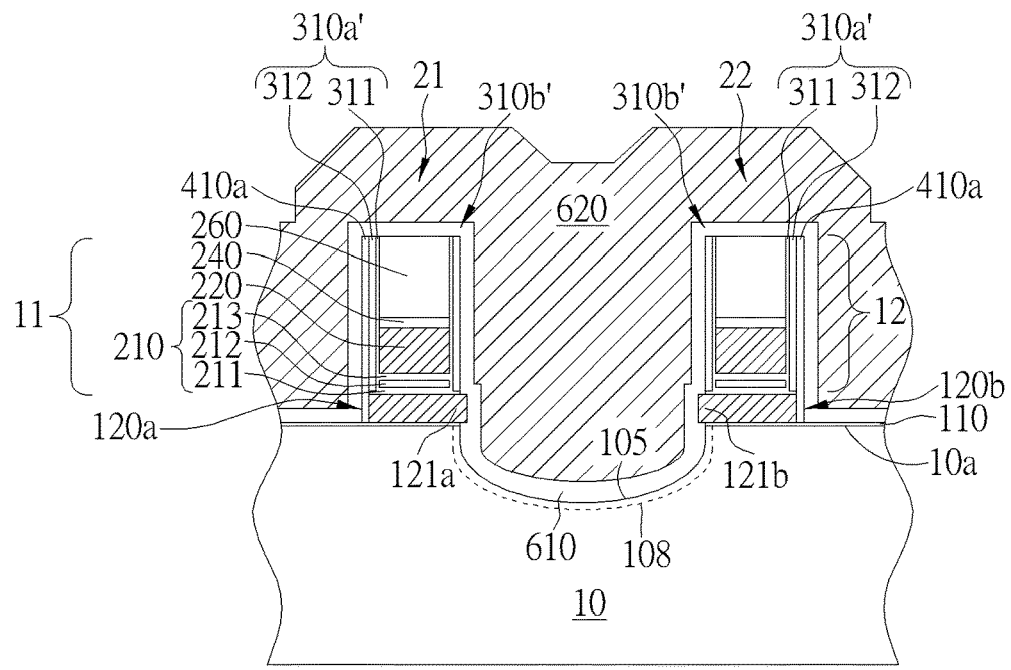

As shown in FIG. 7, a polysilicon layer 620 is then deposited over the substrate 10 in a blanket manner. According to one embodiment, the polysilicon layer 620 conformally covers the stacked gate structures 21 and 22. At this point, the recessed region 105 and the space between the two adjacent stacked gate structures 21 and 22 are completely filled up with the polysilicon layer 620.

Figure 8:
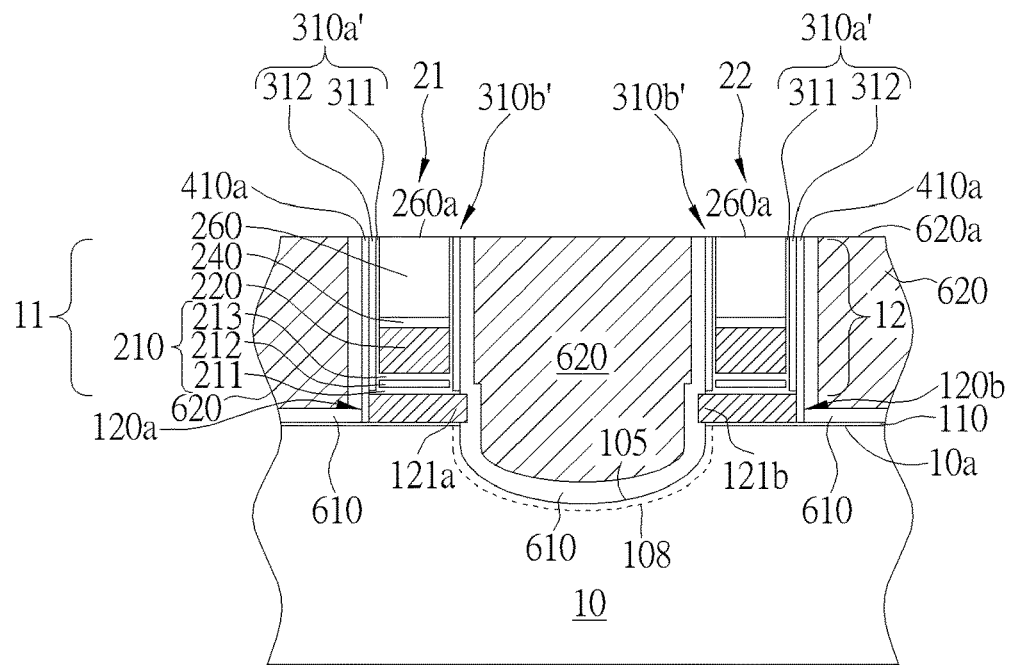

Subsequently, as shown in FIG. 8, a chemical mechanical polishing (CMP) process may be performed to polish the polysilicon layer 620 until the top surface 260a of the dielectric cap layer 260 is exposed. After the CMP process, for example, the top surface 620a of the remaining polysilicon layer 620 is flush with the top surface 260a of the dielectric cap layer 260.

Figure 9:
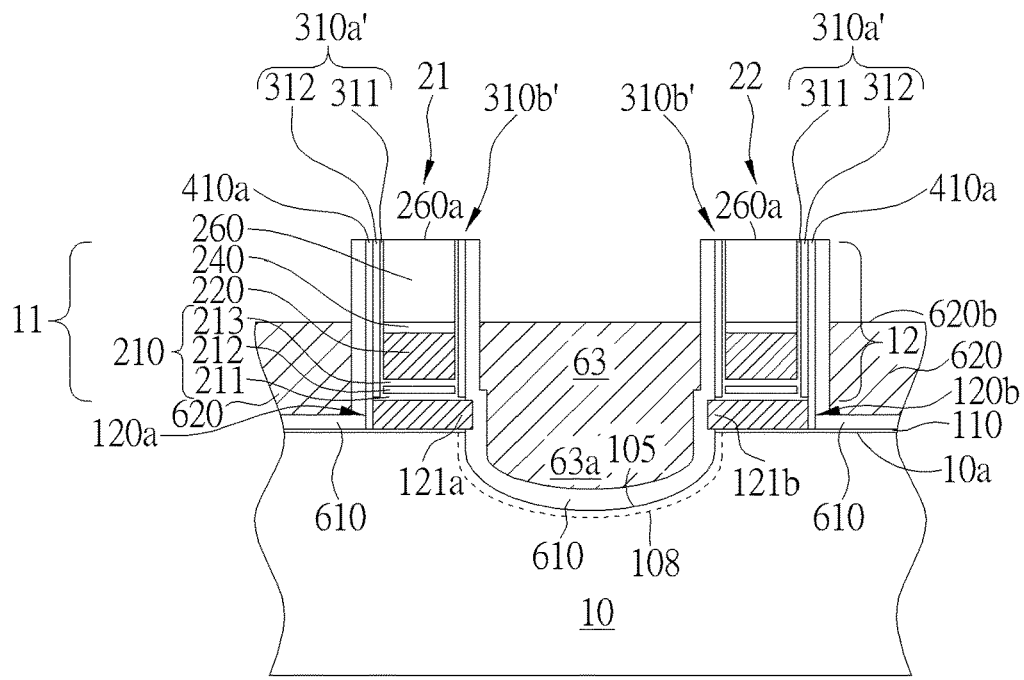

As shown in FIG. 9, an etching back process is then performed to etch the remaining polysilicon layer 620, thereby forming an erase gate 63 in and on the recessed region 105. At this point, the top surface 620b of the remaining polysilicon layer 620 is lower than the top surface 260a of the dielectric cap layer 260. The protruding end portions 121a and 121b of the floating gates 120a and 120b are close to the erase gate 63. The protruding end portions 121a and 121b of the floating gates 120a and 120b are insulated from the erase gate 63 by the tunnel dielectric layer 610. The erase gate 63 is insulated from the control gates 11 and 21 with oxide-nitride spacers 310b' and the tunnel dielectric layer 610 disposed above the protruding end portion 121a and 121b of the floating gates 120a and 120b, respectively.

Figure 10:
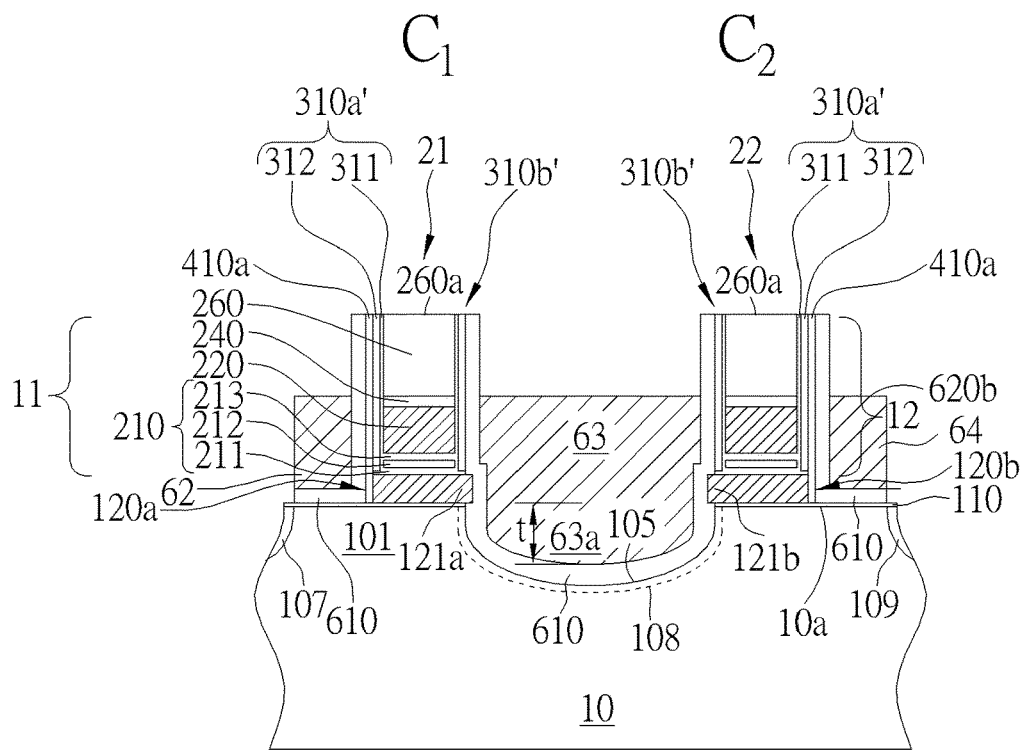

Subsequently, as shown in FIG. 10, a lithographic process and an etching process are performed to pattern the remaining polysilicon layer 620 into select gates 62 and 64 on the stacked gate structures 21 and 22 that is opposite to the erase gate 63. An ion implantation process is then performed to form drain regions 107 and 109 such as N+ regions in the substrate 10 adjacent to the select gates 62 and 64, respectively.

The select gate 62 is disposed between the floating gate 120a and the drain region 107. The select gate 64 is disposed between the floating gate 120b and the drain region 109. FIG. 10 shows two symmetric nonvolatile memory cells $C_1$ and $C_2$, which commonly share the erase gate 63 and the source region 108. The erase gate 63 comprises a lower end portion 63a in the recessed region 105.

For example, in FIG. 10, the nonvolatile memory cell $C_1$ comprises the substrate 10 having the drain region 107, the source region 108, and a channel region 101 between the drain region 107 and the source region 108. The floating gate 120a and the select gate 62 are disposed on the channel region 101. The control gate 11 is disposed on the floating gate 120a. The erase gate 63 is disposed on the source region 108. The erase gate 63 comprises a lower end portion 63a that extends into a major surface 10a of the substrate 10.

The select gate 62 is disposed between the drain region 107 and the floating gate 120a. The lower end portion 63a has a thickness t under the major surface that is smaller than 0.1 micrometers. The floating gate 120a comprises the protruding end portion 121a that is close to the erase gate 63. The protruding end portion 121a protrudes beyond the vertical sidewall of the control gate 11. The erase gate 63 is insulated from the control gate 11 with the oxide-nitride spacer 310b' and the tunnel dielectric layer 610 disposed above the protruding end portion 121a of the floating gate 120a. The tunnel dielectric layer 610 extends to a vertical sidewall of the floating gate 120a and insulates the erase gate 63 from the floating gate 120a. The tunnel dielectric layer 610 further extends to the recessed region 105 in the source region 108 and insulates the lower end portion 63a of the erase gate 63 embedded in the recessed region 105 from the substrate 10. The tunnel dielectric layer 610 comprises a high-temperature oxide (HTO) film.

Figure 11:
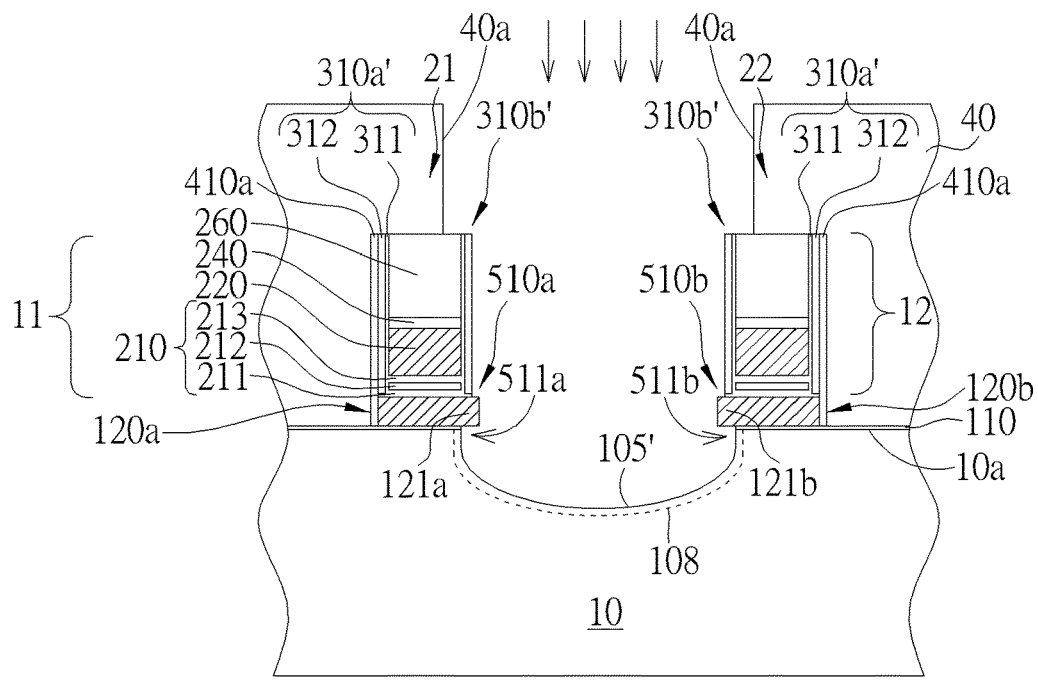
FIG. 11 and FIG. 12 are schematic, cross-sectional diagrams showing a method for fabricating a nonvolatile memory cell according to another embodiment of the invention.
Figure 12:
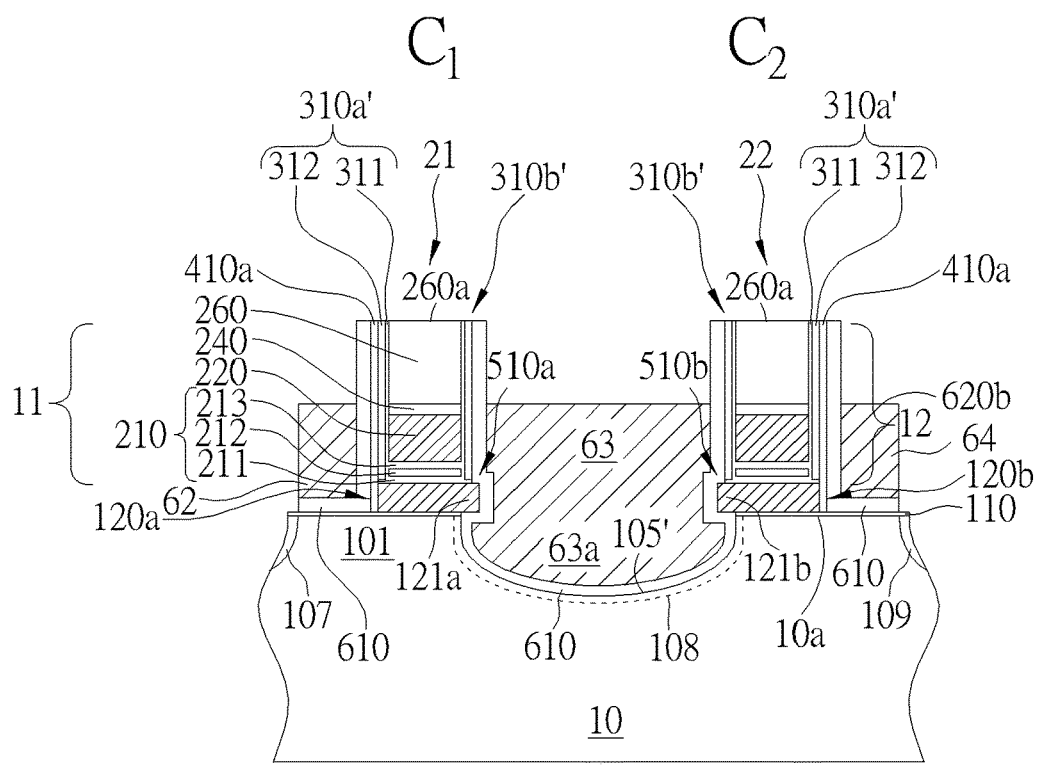

FIG. 11 and FIG. 12 are schematic, cross-sectional diagrams showing a method for fabricating a nonvolatile memory cell according to another embodiment of the invention, wherein like numeral numbers designate like layers, elements, or regions. Subsequent to the formation of the recessed region 105 as depicted in FIG. 5, a lateral etching process such as an isotropic wet etching process may be performed to laterally etch the substrate 10 in the recessed region 105, thereby forming a widened recessed region 105'. The protruding end portions 121a and 121b overhang the widened recessed region 105', as denoted by 511a and 511b.

An ion implantation process may be carried out to form the source region 108 in the substrate 10. According to one embodiment, the source region 108 may be an N+ source region. According to one embodiment, the source region 108 may completely overlap with the widened recessed region 105'. According to one embodiment, the widened recessed region 105' is disposed within the source region 108. The source region 108 may be formed before the formation of the recessed region 105. Alternatively, the source region 108 may be formed after the formation of the recessed region 105.

Subsequently, the offset spacers 410b are removed and the outer silicon oxide layers 313 of the spacers 310b are removed, thereby forming the spacers 310b'. After removing the outer silicon oxide layers 313 of the spacers 310b and the offset spacers 410b, the photoresist pattern 40 is then removed. The following steps are similar to those steps described through FIG. 6 to FIG. 10.

As shown in FIG. 12, since the widened recessed region 105' extends slightly under the floating gates 120a and 120b, the lower end portion 63a laterally extends from the source region 108 to under the floating gates 120a and 120b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nonvolatile memory cell, comprising:
   a substrate having a drain region, a source region, and a channel region between the drain region and the source region;
   a floating gate and a select gate disposed on the channel region;
   a control gate disposed on the floating gate;
   an erase gate disposed on the source region, wherein the erase gate comprises a lower end portion that extends into a major surface of the substrate wherein the lower end portion further laterally extends from the source region to under the floating gate;
   an oxide-nitride spacer disposed above a protruding end portion of the floating gate; and
   a tunnel dielectric layer between the oxide-nitride spacer and the erase gate.

2. The nonvolatile memory cell according to claim 1, wherein the select gate is disposed between the drain region and the floating gate.

3. The nonvolatile memory cell according to claim 1, wherein the lower end portion has a thickness under the major surface that is smaller than 0.1 micrometers.

4. The nonvolatile memory cell according to claim 1, wherein the protruding end portion protrudes beyond a vertical sidewall of the control gate to the erase gate.

5. The nonvolatile memory cell according to claim 4, wherein the erase gate is insulated from the control gate with the oxide-nitride spacer and the tunnel dielectric layer disposed above the protruding end portion of the floating gate.

6. The nonvolatile memory cell according to claim 5, wherein the tunnel dielectric layer extends to a vertical sidewall of the floating gate and insulates the erase gate from the floating gate.

7. The nonvolatile memory cell according to claim 6, wherein the tunnel dielectric layer further extends to a recessed region of the source region and insulates the lower end portion of the erase gate embedded in the recessed region from the substrate.

8. The nonvolatile memory cell according to claim 5, wherein the tunnel dielectric layer comprises a high-temperature oxide (HTO) film.

9. A method for fabricating a nonvolatile memory cell, comprising:
   providing a substrate having thereon gate structure comprising a floating gate and a control gate on the floating gate;
   forming an oxide-nitride spacer on a sidewall of the control gate and on a protruding end portion of the floating gate;
   forming a recessed region in the substrate adjacent to the floating gate;

forming a source region in the substrate, wherein the source region overlaps with the recessed region;

depositing a tunnel dielectric layer on the oxide-nitride spacer and the gate structure and in the recessed region; and forming an erase gate in and on the recessed region wherein the erase gate comprises a lower end portion in the recessed region; wherein the lower end portion further laterally extends from the source region to under the floating gate.

10. The method according to claim 9 further comprising:

forming an oxide-nitride-oxide (ONO) film between the floating gate and the control gate.

11. The method according to claim 9 further comprising:

forming a select gate on a side of the gate structure that is opposite to the erase gate; and forming a drain region in the substrate that is adjacent to the select gate.

12. The method according to claim 11, wherein the select gate is disposed between the drain region and the floating gate.

13. The method according to claim 9, wherein the protruding end portion protrudes beyond a vertical sidewall of the control gate to the erase gate.

14. The method according to claim 13, wherein the erase gate is insulated from the control gate with the oxide-nitride spacer and the tunnel dielectric layer disposed above the protruding end portion of the floating gate.

15. The method according to claim 9, wherein the tunnel dielectric layer comprises a high-temperature oxide (HTO) film.

* * * * *